United States Patent [19]
Fujii et al.

[11] Patent Number: 5,700,546
[45] Date of Patent: Dec. 23, 1997

[54] SEAL OR BEARING

[75] Inventors: Kanenaga Fujii; Masato Kiuchi, both of Osaka; Hiroshi Nagasaka; Yoshikazu Kimura, both of Kanagawa-ken; Naoki Tsuchiya, Tokyo, all of Japan

[73] Assignees: Ebara Corporation; Agency Of Industrial Science and Technology, both of Tokyo, Japan

[21] Appl. No.: 453,004

[22] Filed: May 30, 1995

[30] Foreign Application Priority Data

May 30, 1994 [JP] Japan ................................ 6-139431
May 26, 1995 [JP] Japan ................................ 7-128408

[51] Int. Cl.⁶ ................................................ F16J 15/44
[52] U.S. Cl. ................ 428/156; 428/141; 428/336; 428/457; 428/469; 428/408; 428/472; 428/698; 384/492; 384/619; 384/907; 384/913
[58] Field of Search ................................ 428/408, 698, 428/141, 156, 336, 457, 469, 472; 384/492, 619, 907, 913

[56] References Cited

U.S. PATENT DOCUMENTS

| 4,522,453 | 6/1985 | Lammer et al. | 428/698 |
| 4,797,009 | 1/1989 | Yamazaki . | |
| 5,322,735 | 6/1994 | Fridez et al. | 428/698 |

FOREIGN PATENT DOCUMENTS

| 0 286 024 A2 | 10/1988 | European Pat. Off. . |
| 0 454 616 A1 | 10/1991 | European Pat. Off. . |
| 61-257466 | 11/1986 | Japan . |
| 63-62862 | 3/1988 | Japan . |
| 64-46018 | 2/1989 | Japan . |
| 1-168856 | 7/1989 | Japan . |
| 5-193916 | 8/1993 | Japan . |

OTHER PUBLICATIONS

Wang Xi et al., "Thin Solid Films", vol. 202, No. 2, 1991, pp. 315–320.

Ebara Review No. 165, "Sliding Properties of Titanium Nitrade Films Prepared by Dynamic Ion Mixing" with attached English translation (1992).

Nuclear Instruments and Methods in Physics Research B80/81 (1993) pp. 1380–1383; North Holland Physics Publishing.

Abstract of the Great Spring Meeting of the Japan Institute of Metals (Spring, 1993) "Wear and Friction Properties of Titanium Nitride Films Prepared by Dynamic Ion Mixing".

*Primary Examiner*—Archene Turner
*Attorney, Agent, or Firm*—Armstrong, Westerman Hattori, McLeland & Naughton

[57] ABSTRACT

A seal or bearing comprising a combination of a movable member and a stationary member, either one of the movable and stationary members being made of a low thermal expansion coefficient material, and the other being made of a carbon containing material, wherein a sliding surface of the movable or stationary member which is made of the low thermal expansion coefficient material is irradiated with an ion beam consisting essentially of nitrogen ions at the same time as titanium is vacuum-deposited on the sliding surface, thereby forming a thin titanium nitride film on the sliding surface, which provide a seal or bearing which has a reduced coefficient of friction, and which is improved in wear resistance.

10 Claims, 13 Drawing Sheets

RESULTS OF COMPARISON
OF FRICTION COEFFICIENT

RESULTS OF COMPARISON OF SPECIFIC WEAR RATE OF CARBON

CRITICAL SURFACE PRESSURE IN COMBINATION OF EACH HARDENED MATERIAL AND CAST IRON

SCHEMATIC VIEW OF FRICTIONAL WEAR TESTING

SEAL OR BEARING

BACKGROUND OF THE INVENTION

1. Field of the Art

The present invention relates to a seal or bearing which has a high wear resistance and a low coefficient of friction. More particularly, the present invention relates to a seal or bearing which is suitable for use in fluid machinery, e.g., pumps, turbines, compressors, etc., which uses high pressure fluid.

2. Prior Art

Many conventional seals or bearings which have heretofore been used for fluid machinery, e.g., pumps, turbines, compressors, etc., have an arrangement comprising a combination of a movable member which employs either a hard metal or a ceramic material as a substrate, and a stationary member which is made of a material consisting essentially of carbon.

With the need for fluid machinery to be reduced in size, operate at higher speed and increase in capacity, service conditions under which seals and bearings are used have become increasingly adverse in recent years. That is, seals and bearings are now used under high-speed and heavy-load conditions. Accordingly, it has been pointed out that a material such as a hard metal which has heretofore been used for seals and bearings Gives rise to problems such as fracturing under thermal shock and thermal fatigue cracking, caused by repeated application of frictional heat generated by sliding contact between solids.

On the other hand, ceramic materials, e.g., SiC, are superior to hard metals in resistance to thermal stress caused by sliding. However, when used as a material for a high-speed rotating member, a ceramic material is disadvantageously inferior in mechanical strength such as resistance to shock. Further, when a metallic material is used as a sliding member, the surface of the metallic material may be subjected to carburizing, nitriding or other similar hardening treatment. With these surface treatments, however, no satisfactory sliding surface can be obtained in terms of the hardness of the modified layer itself and the deformation of the substrate after the treatment.

SUMMARY OF THE INVENTION

In view of the above-described circumstances, an object of the present invention is to provide a seal or bearing which has a reduced coefficient of friction, and which demonstrate improved wear resistance.

To solve the above-described problems, the present invention provides a seal or bearing comprising a combination of a movable member and a stationary member, either one of the movable and stationary members being made of a low thermal expansion coefficient material, and the other being made of a carbon containing material, wherein a thin titanium nitride film is formed on a sliding surface of the movable or stationary member which is made of the low thermal expansion coefficient material.

The carbon containing material may comprise a carbon containing composite material, a carbon steel, a cast iron, a carbide, a carbon coated material, a polymer or the like.

In the above-described seal or bearing, the thin titanium nitride film is typically formed by irradiating the sliding surface of the movable or stationary member which is made of the low thermal expansion coefficient material with an ion beam consisting essentially of nitrogen ions at the same time as titanium is vacuum-deposited on the sliding surface.

A dose energy of the nitrogen ion beam is preferably in a range of from 0.1 W/cm$^2$ to 6 W/cm$^2$.

Preferably, the Vickers hardness of the thin titanium nitride film is 2500 or more and the adhesion between the film and the substrate of the low thermal expansion coefficient material is 2.8 GPa or more.

Further, it is preferable that the thickness of the film is 2 μm or more and the surface roughness Rmax of the sliding surface of the film is 0.5 μm or less.

As described above, the sliding surface of the movable or stationary member of a seal or bearing is irradiated with an ion beam consisting essentially of nitrogen ions at the same time as titanium is vacuum-deposited on the sliding surface, thereby forming a thin titanium nitride film on the sliding surface. Consequently, since the thin titanium nitride film has a minimal coefficient of friction and excellent wear resistance, as detailed later, with respect to the stationary or movable member as a sliding member which is made of a carbon containing material, it is possible to provide a seal or bearing which has a minimal coefficient of friction and a low rate of wear, and which is superior in frictional characteristics.

In this case, since a material having low thermal expansion coefficient is used in a movable or stationary member on which a thin titanium nitride film is formed, an amount of deformation during manufacturing and operation of a seal or bearing is relatively small. Thus, it is possible to suppress an amount of leakage in a seal or an amount of wear in a bearing to be as small as possible.

In particular, when a movable or stationary member provided with a thin titanium nitride film thereon is combined with a stationary or movable member made of a cast iron, since the thin titanium nitride film exhibits a large critical surface pressure relative to the cast iron as will be explained hereinafter, it is possible to provide a seal or bearing which has superior wear resistance and draw resistance and is excellent in frictional wear characteristics.

In addition, by setting the dose energy of the nitrogen ion beam within the range of from 0.1 W/cm$^2$ to 6 W/cm$^2$, a thin titanium nitride film which is superior in both hardness and adhesion can be formed on the sliding surface of the movable or stationary member. That is, the thin titanium nitride film has a Vickers hardness of 2,500 or more, and the adhesion of the film to the substrate material is 2.8 GPa or more in terms of the shear stress measured by a scratch test.

When a Vickers hardness of a thin titanium nitride film is 2500 or more or the adhesion force of the film to the substrate material is 2.8 GPa or more, the specific rate of wear of the mating sliding material can be made remarkably small.

Further, when the thickness of a thin titanium nitride film is greater than 2 μm, the specific rate of wear of the mated sliding material and the film itself can be made remarkably small.

In addition, when the surface roughness of the film is smaller than 0.5 μm, the specific rate of wear of the mated sliding material can be made remarkably small.

The above and other objects, features and advantages of the present invention will become more apparent from the following description when taken in conjunction with the accompanying drawings in which preferred embodiments of the present invention are shown by way of illustrative examples.

PREFERRED EMBODIMENTS OF THE INVENTION

Figure 1:
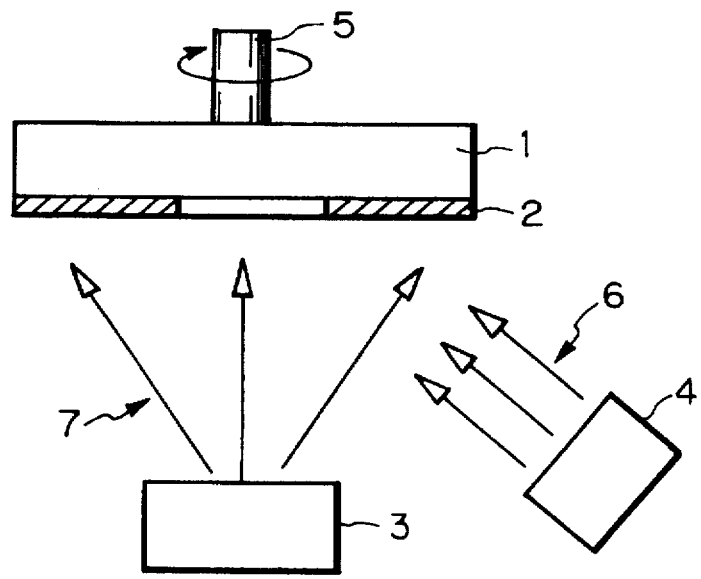
FIG. 1 is a conceptual view showing the arrangement for forming a thin titanium nitride film on a sliding surface of a movable member used in the seal or bearing of the present invention.

Preferred embodiments of the present invention will be described below with reference to the accompanying drawings. FIG. 1 is a conceptual view showing the arrangement for forming a thin titanium nitride film on a sliding surface of a movable member used in the seal or bearing of the present invention. A substrate 2 on which a thin titanium nitride film is to be formed is secured to a copper holder 1 which is secured to the distal end of a rotating shaft 5, and which is water-cooled. An evaporation source 3 and an ion source 4 are disposed to face opposite to the substrate 2. Titanium vapor 7 is emitted from the evaporation source 3 toward the substrate 2, and an ion beam 6 consisting essentially of nitrogen ions is emitted from the ion source 4 toward the substrate 2, thereby forming a thin titanium nitride film. The thin titanium nitride film forming method is called "dynamic ion mixing method".

Figure 2:
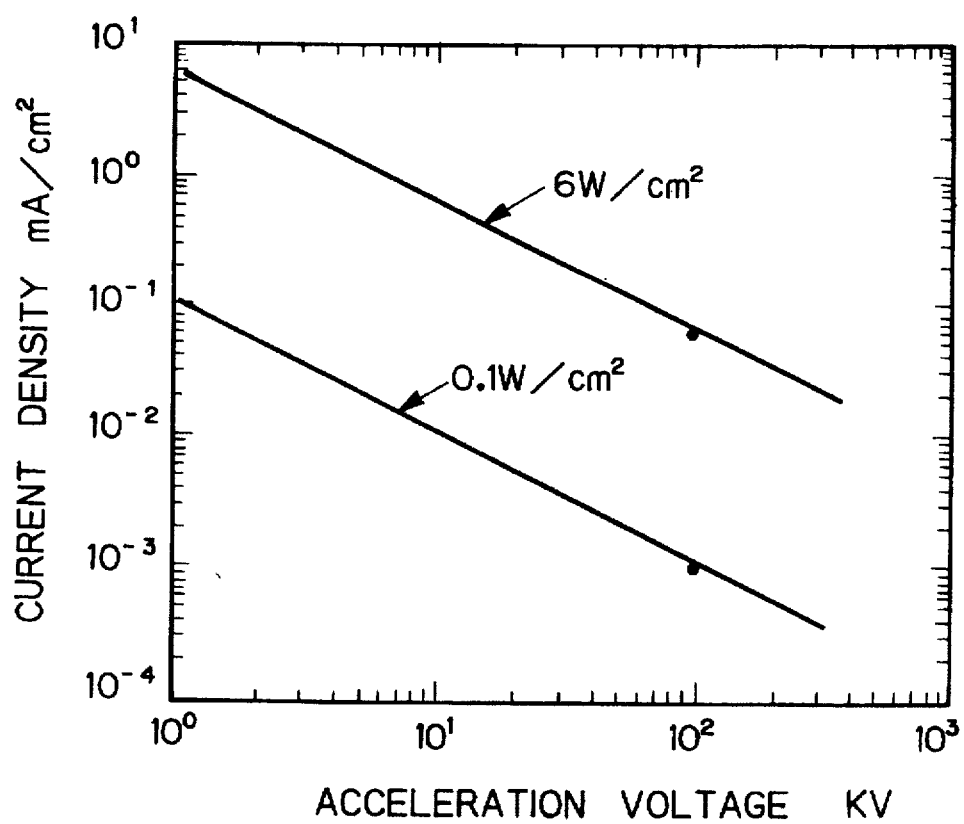
FIG. 2 shows the relationship between the acceleration voltage applied to an ion beam consisting essentially of nitrogen and the current density.

FIG. 2 shows the relationship between the ion beam dose energies of 0.1 W/cm$^2$ and 6 W/cm$^2$ with the acceleration voltage applied to the ion beam consisting essentially of nitrogen ions and the current density plotted along the abscissa and ordinate axes, respectively. If the ion beam dose energy exceeds 6 W/cm$^2$, the thermal effect on the substrate 2 (e.g., change of properties of the material constituting the substrate 2, deformation of the substrate, etc.) becomes undesirably remarkable. If the ion beam dose energy is less than 0.1 W/cm$^2$, the thin titanium nitride film becomes unfavorably inferior in hardness and adhesion. Accordingly, it is preferable to set the ion beam dose energy within the range of from 0.1 W/cm$^2$ to 6 W/cm$^2$. By doing so, the Vickers hardness of the film itself can be raised to 2,500 or more, and the adhesion between the film and the substrate 2 can be increased to 2.8 GPa or more (in terms of shear stress measured by a scratch test).

Figure 3:
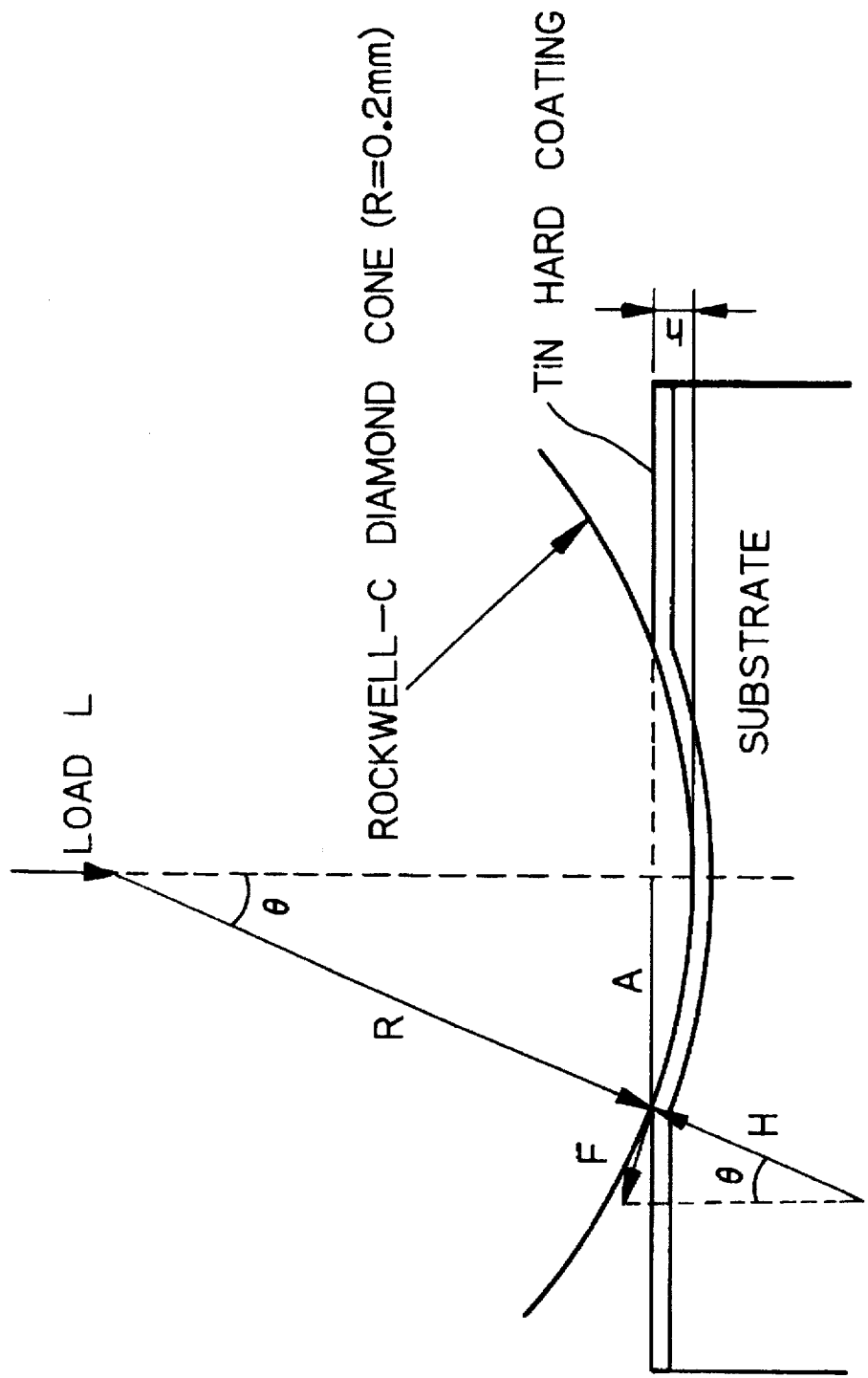
FIG. 3 is a schematic representation of Benjamin and Weaver model for obtaining an adhesive force between the film and the substrate.

Incidentally, the adhesion force between the film and the substrate may be obtained by means of a scratch test wherein a load is applied to the surface of thin titanium nitride film through a Rockwell-C diamond cone (radius=0.2 mm; cone angle=120° C.) and a critical load L upon the film is peeled off from the substrate is measured. Specifically, the adhesion force is obtained through the Benjamin and Weaver's hypothesis regarding the shearing stress as shown in FIG. 3. This method depends on the idea that the shearing stress is caused at an interface area between the film and the substrate where the diamond cone is caved in the film and the peeling off the film is caused thereby.

The adhesion force F is given by the following equations.

$$H = L/\pi A^2$$

$$F = H \times A/(R^2 - A^2)^{1/2}$$

Here,

L: a critical load needed for peeling off

A: a groove width of scratch traces

R: a radius of a diamond cone

H: Brinell hardness of substrate

Specific examples will be explained below. A martensite stainless steel was used as a material for the substrate 2. After being processed into a predetermined ring shape, the stainless steel was subjected to hardening (after being held at 1,050° C. for 1 hour, the stainless steel was subjected to oil quenching) and tempering (after being held at 650° C. for 2 hours, the stainless steel was subjected to furnace cooling). Thereafter, a surface of the substrate 2 on which a film was to be formed was lapped until the surface roughness Rmax reached 0.1 μm or less. It should be noted that a member which is to be mated with the substrate 2, that is, a stationary member of the seal or bearing, is formed by using a commercially available resin-impregnated hard carbon material and lapping the sliding surface of the carbon material.

The lapped surface of the substrate 2 was irradiated with a nitrogen ion beam at an incidence angle of 45° for 3 minutes (acceleration voltage: 10 kV; current density: 0.2 mA/cm$^2$), thereby sputter-cleaning the surface. Thereafter, titanium was evaporated so that the titanium deposition rate was from 0.5 to 5.0 nm/s, and at the same time, the surface of the substrate 2 was irradiated with a nitrogen ion beam at an incidence angle of 45° (acceleration voltage: 15 kV; current density: 0.2 mA/cm$^2$), thereby forming a titanium nitride film until the film thickness reached 3 μm.

Figure 4:
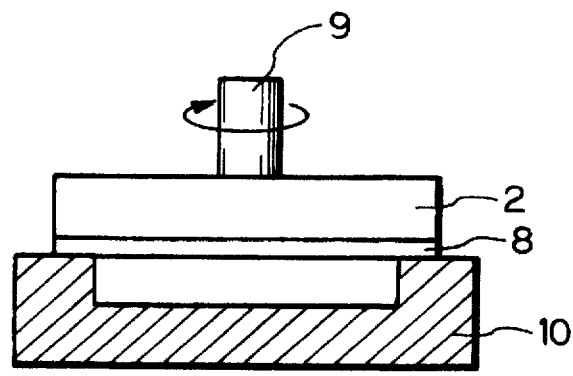
FIG. 4 schematically shows the arrangement of a testing machine used to carry out a test for frictional wear of hard carbon caused by a thin titanium nitride film formed on the substrate surface.

FIG. 4 schematically shows the arrangement of a testing machine used to carry out a test for frictional wear of hard carbon caused by the substrate 2. The substrate 2 having a thin titanium nitride film 8 formed on the surface thereof is secured to the distal end of a rotating shaft 9 so as to rotate about the rotating shaft 9. A stationary ring 10 which is made of hard carbon is disposed to face opposite to the surface of the substrate 2 formed with the thin titanium nitride film 8 thereon. In this case, the substrate 2 has a circular shape, and the diameter thereof is 50 mm. The stationary ring 10 has a ring shape. The outer diameter of the stationary ring 10 is 60 mm, and the inner diameter thereof is 40 mm.

Figure 5:
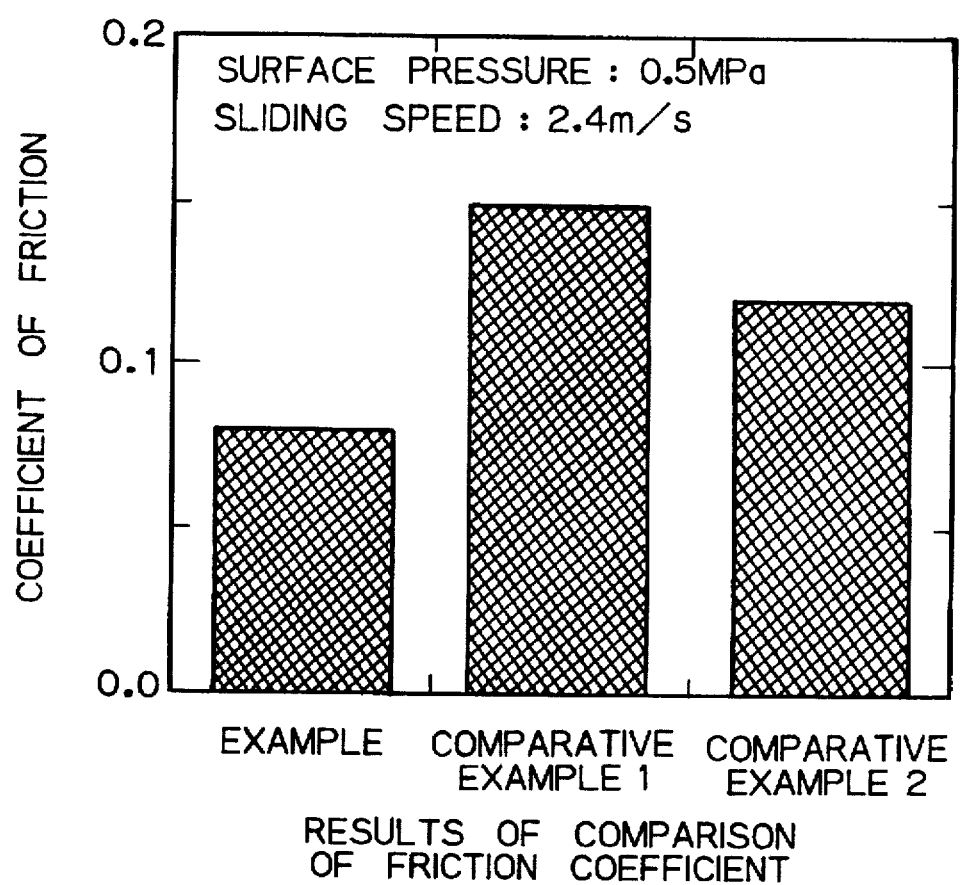
FIG. 5 shows the results of comparison as to the coefficient of friction between various combinations of rotating rings and a stationary ring of hard carbon.
Figure 6:
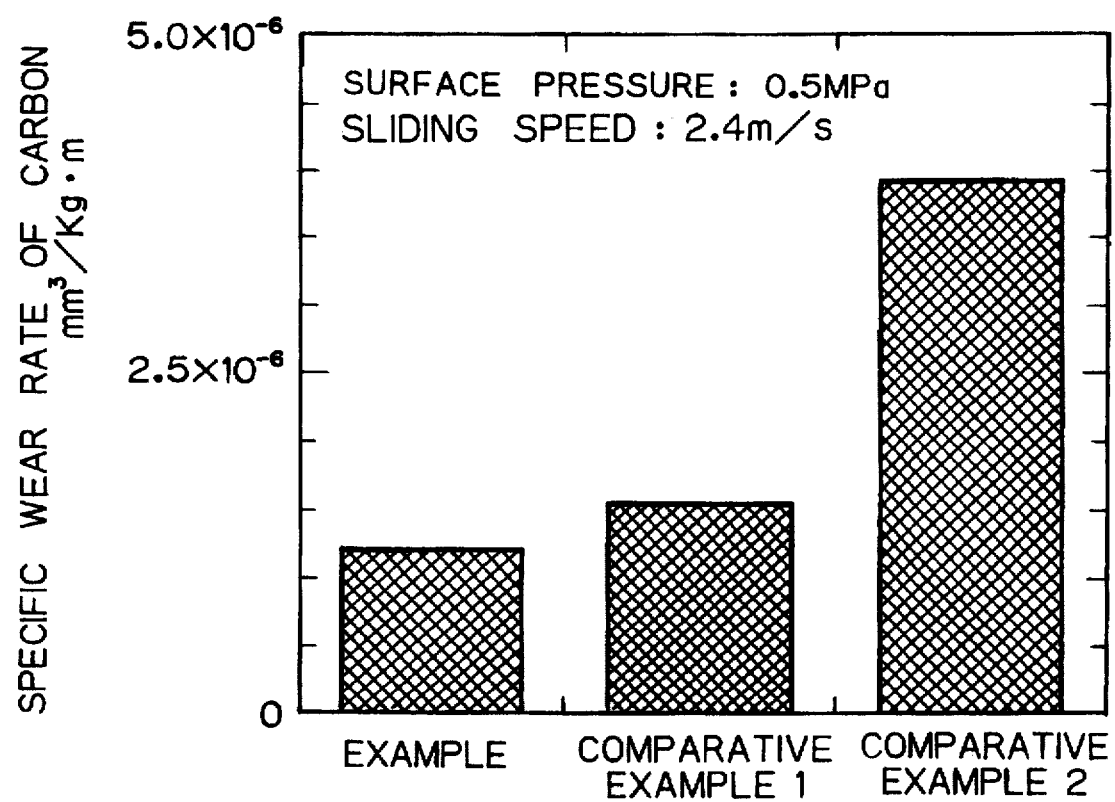
FIG. 6 shows the results of comparison as to the specific rate of wear of hard carbon between various combinations of rotating rings and a stationary ring of hard carbon.

The test was carried out in the air at room temperature by using the frictional wear testing machine having the above-described arrangement under the conditions that the surface pressure applied to the titanium nitride film surface of the substrate 2 was 0.5 MPa, the sliding speed was 2.4 m/s, and the sliding distance was 5,000 m. Under these conditions, the coefficient of friction and the rate of wear were measured. The results of the test are shown in FIGS. 5 and 6. In FIGS. 5 and 6, in Example, a martensite stainless steel was used for the substrate 2, and a thin titanium nitride film was formed on the surface of the substrate 2 by the dynamic ion mixing method. In Comparative Example 1, a hard metal was used for the substrate 2, and in Comparative Example 2, SiC was used for the substrate 2.

As will be clear from FIGS. 5 and 6, the substrate 2 in the present invention has a reduced coefficient of friction and a reduced specific wear rate in comparison to the prior art (Comparative Examples 1 and 2), and makes it possible to realize a seal or bearing which is superior to the prior art in frictional characteristics.

Figure 7:
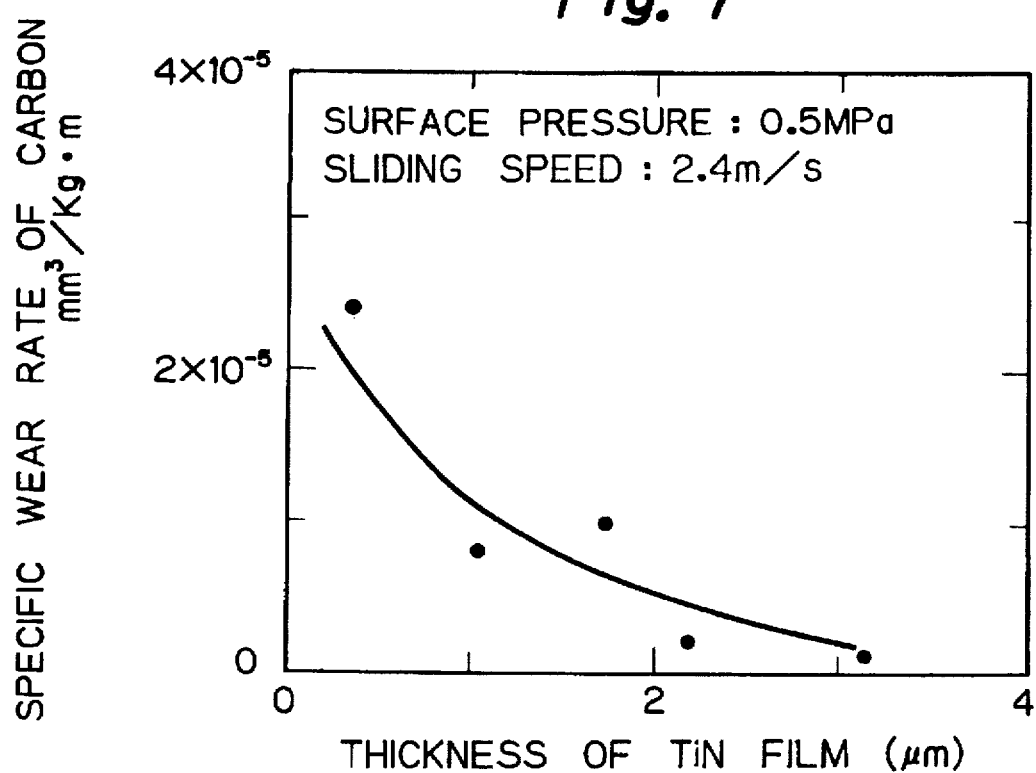
FIG. 7 is a view showing the relationship between the thickness of a thin titanium nitride film and the specific rate of wear of hard carbon.
Figure 8:
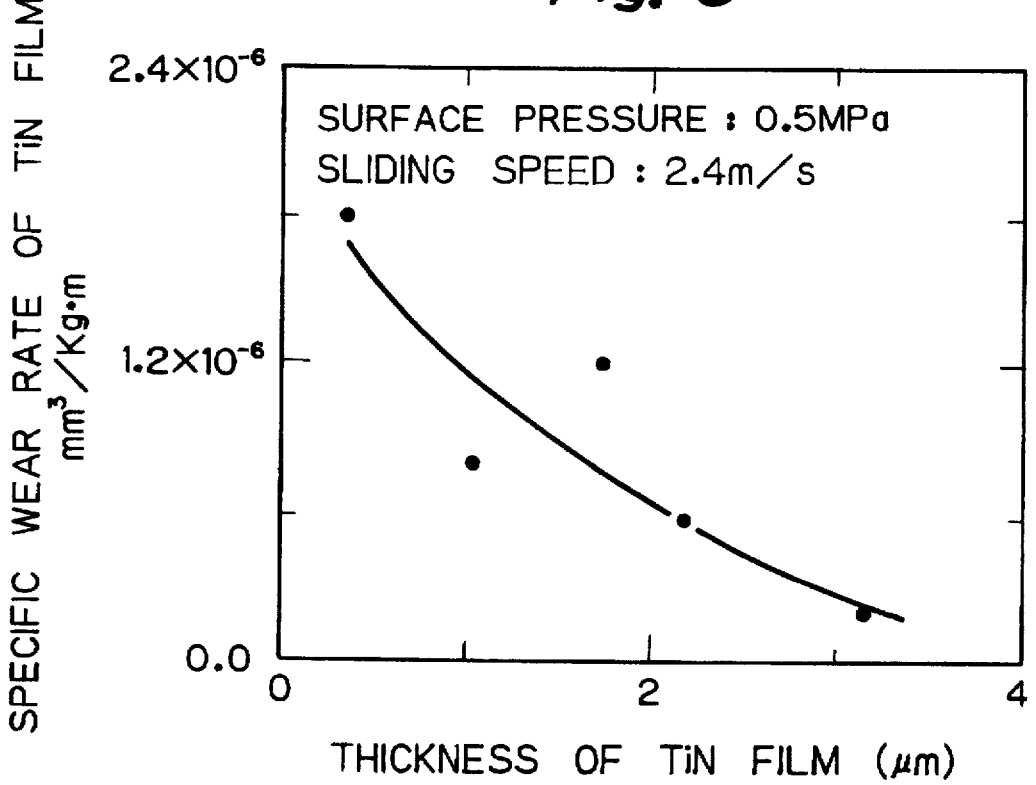
FIG. 8 is a view showing the relationship between the thickness of a thin titanium nitride film and the specific rate of wear of the film itself.

FIGS. 7 and 8 show the results of measurement regarding the relationship between the thickness of a thin titanium nitride film and the specific rate of wear of the mated sliding material, i.e., hard carbon and the relationship between the thickness of a thin titanium nitride film and the specific rate of wear of the film itself, respectively.

As will be understood from FIGS. 7 and 8, when the thickness of a thin titanium nitride film is greater than 2 μm, the specific rate of wear of the mated sliding material, i.e., hard carbon and the film itself is remarkably small.

Figure 9:
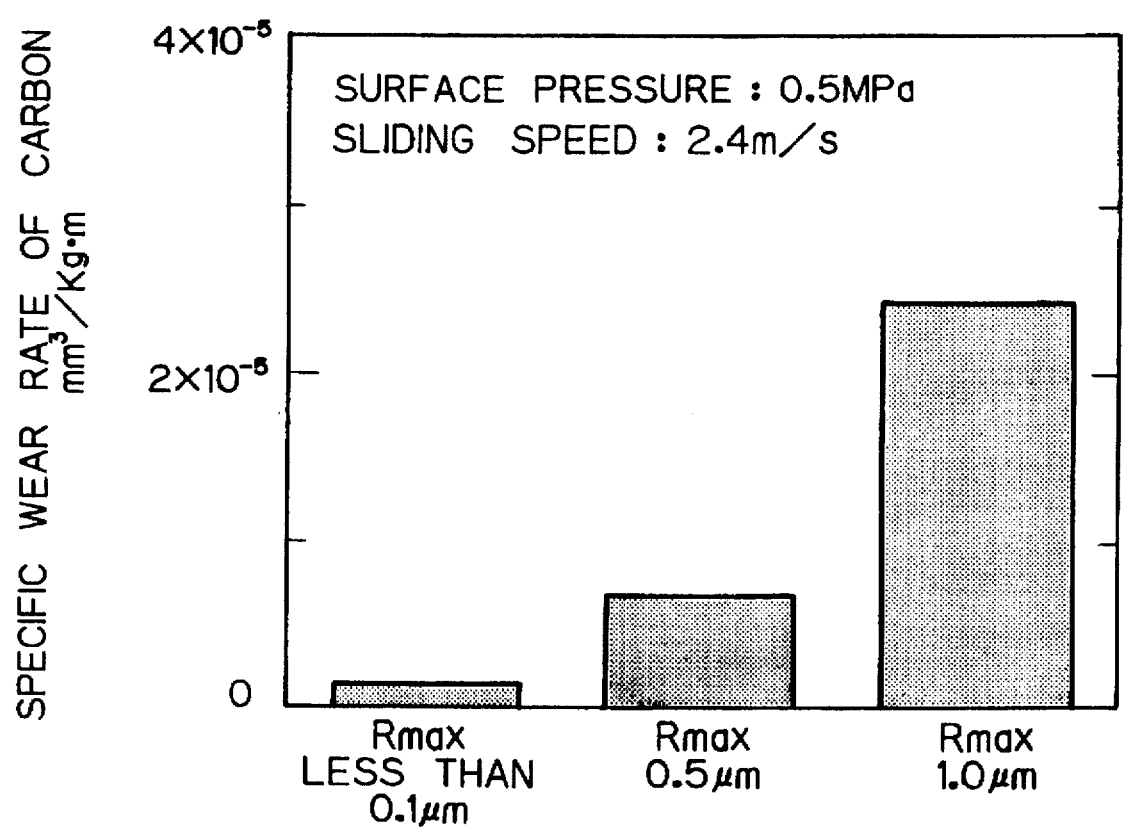
FIG. 9 is a view showing the relationship between the surface roughness of the sliding surface of a thin titanium nitride film and the specific rate of wear of hard carbon.

FIG. 9 shows the results of measurement regarding the relationship between the surface roughness Rmax of the sliding surface of a thin titanium nitride film and the specific rate of wear of the mated sliding material, i.e., hard carbon.

From FIG. 9, it will be understood that the specific rate of wear of the mated sliding material is remarkably small when the surface roughness of the film is smaller than 0.5 μm.

Figure 10:
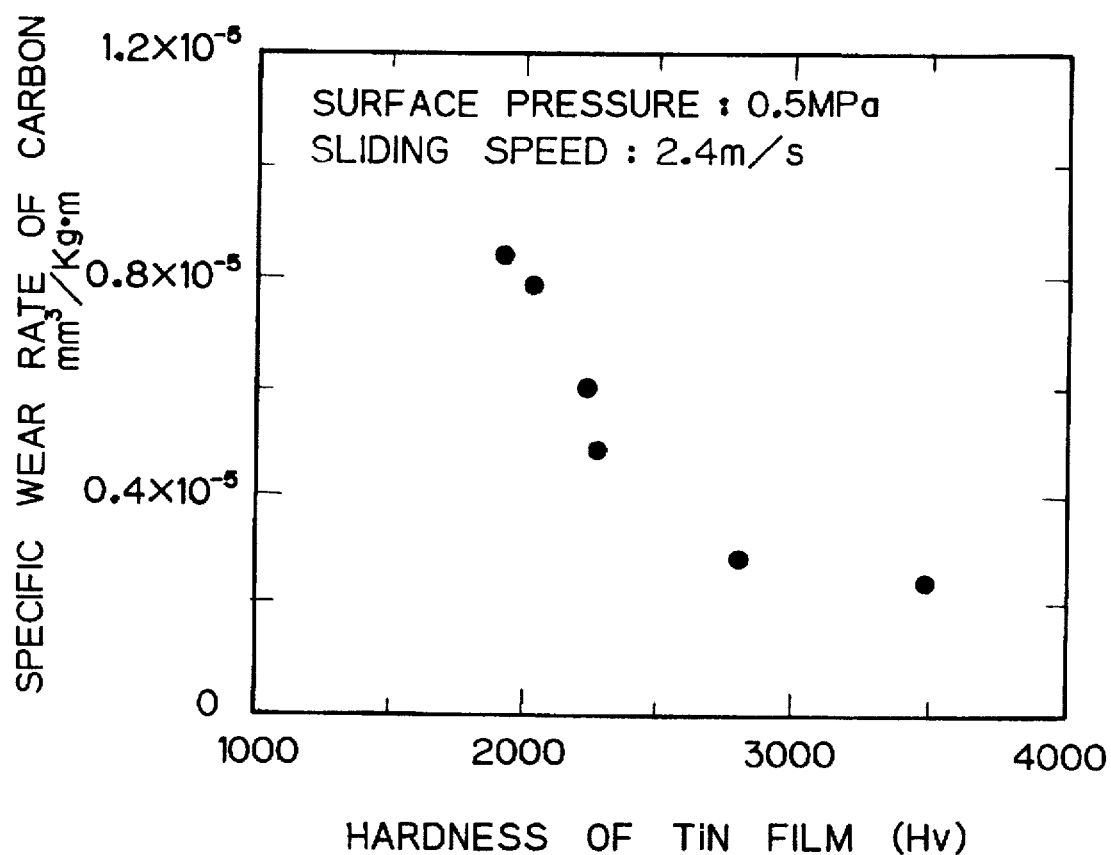
FIG. 10 shows the relationship between a Vickers hardness of a thin titanium film and the specific rate of wear of hard carbon.

FIG. 10 shows the relationship between a Vickers hardness of a thin titanium film and the specific rate of wear of the mating sliding material, i.e., hard carbon in this case.

As will be clear from FIG. 10, the specific rate of wear of the mating sliding material, i.e., hard carbon, is remarkably small when a Vickers hardness of a thin titanium film is greater than 2500.

Table 1 shows the results of comparative test regarding the adhesion force between a thin titanium nitride film and the substrate material (martensite stainless steel) and the specific rate of wear of the mating sliding material, hard carbon in this case.

A thin titanium nitride film was formed by a dynamic ion mixing method in an example of the invention, while it was formed by an ion plating method in a comparative example.

From this table, it will be understood that the adhesion force in the example of this invention is greater than twice that of the comparative example, and that the specific rate of wear of hard carbon is remarkably small when the adhesion force is greater than 2.8 GPa.

TABLE 1

| | Surface pressure: 0.5 MPa Sliding speed: 2.4 m/s | | |
|---|---|---|---|
| | Scratch Test | | Frictional Wear Test |
| | Critical Load (N) | Adhesion Force (GPa) | Specific Wear Rate of Carbon mm$^3$/kg · m |
| Example of Invention | 96 | 2.84 | $0.2 \times 10^{-5}$ |
| Comparative Example | 47 | 1.35 | $1.1 \times 10^{-5}$ |

Figure 11:
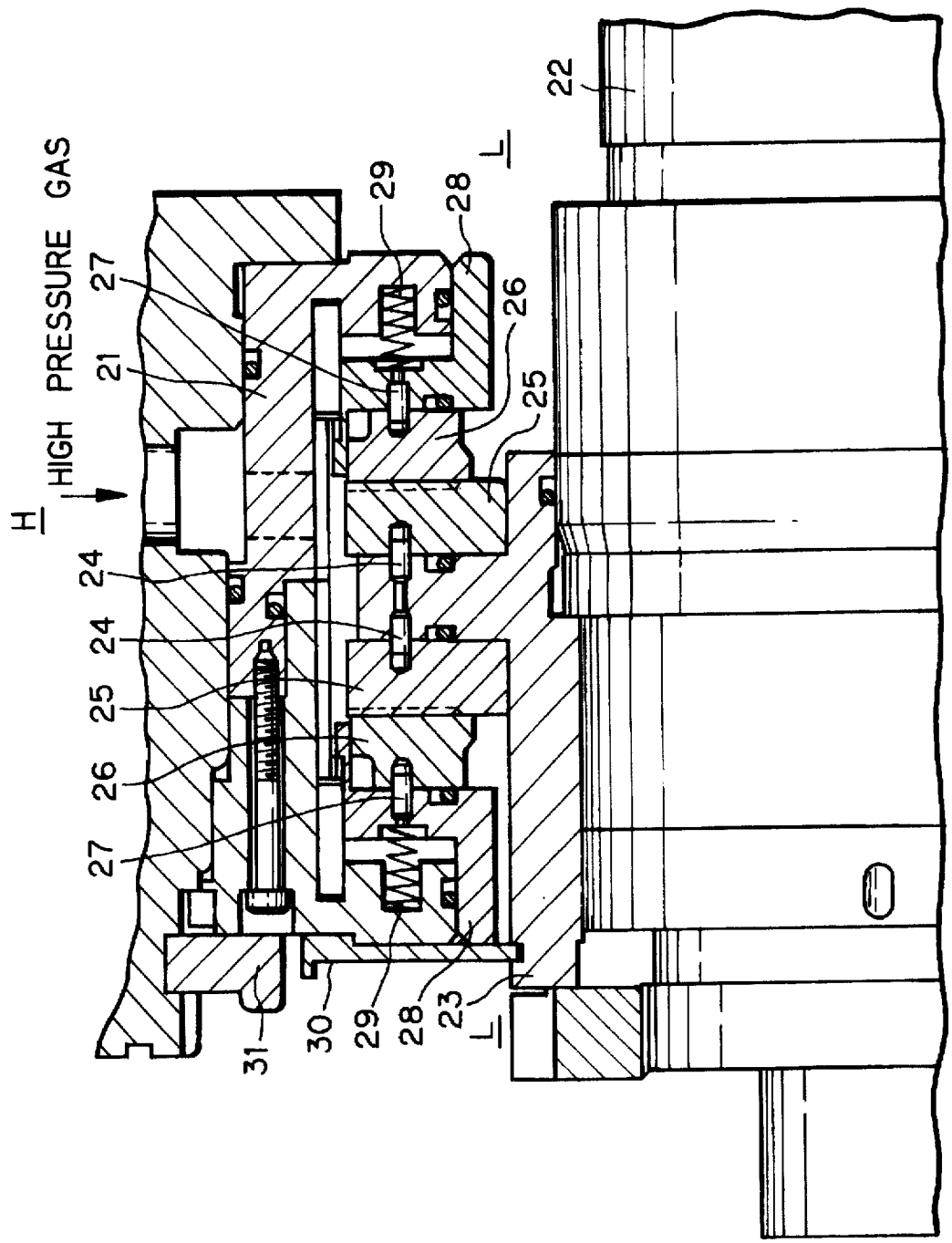
FIG. 11 shows an example of the arrangement of a non-contact end-face seal in a centrifugal compressor to which a seal of the present invention may be applied.

Next, a specific example in which the present invention is applied to a mating ring for a centrifugal compressor will be explained. FIG. 11 shows an example of the arrangement of a non-contact end-face seal used in a centrifugal compressor. In the figure, a rotating shaft 22 which is accommodated in a seal housing 21 is provided with a shaft sleeve 23. The shaft sleeve 23 retains rotating rings 25 (mating rings) through keys 24. A fixed ring 26 is provided to face opposite to each rotating ring 25. A martensite stainless steel is used for the substrate of each rotating ring 25, and a thin titanium nitride film is formed on the sliding surface of the rotating ring 25 by the dynamic ion mixing method in the same way as the above. Further, the sliding surface of each rotating ring 25 is formed with spiral groove (not shown) extending from the high-pressure side H toward the low-pressure side L.

Each fixed ring 26 is connected to a seal ring retainer 28 through a pin 27, and a spring 29 is interposed between the seal ring retainer 28 and the seal housing 21. Each fixed ring 26 is pressed against the associated rotating ring 25 through the spring 29 and the seal ring retainer 28. It should be noted that reference numeral 30 denotes a lock plate, and 31 a shearing key.

In the non-contact end-face seal having the above-described arrangement, as the rotating shaft 22 rotates, the rotating rings 25 and the fixed rings 26 move relative to each other, thereby drawing a fluid on the high-pressure side H into the spiral grooves formed in the rotating rings 25, and thus forming a fluid film on the sealing surfaces. The fluid film allows the sealing surfaces to be brought into a non-contact state, and a slight clearance is formed between the sealing surfaces of the rotating and fixed rings 25 and 26.

Figure 12:
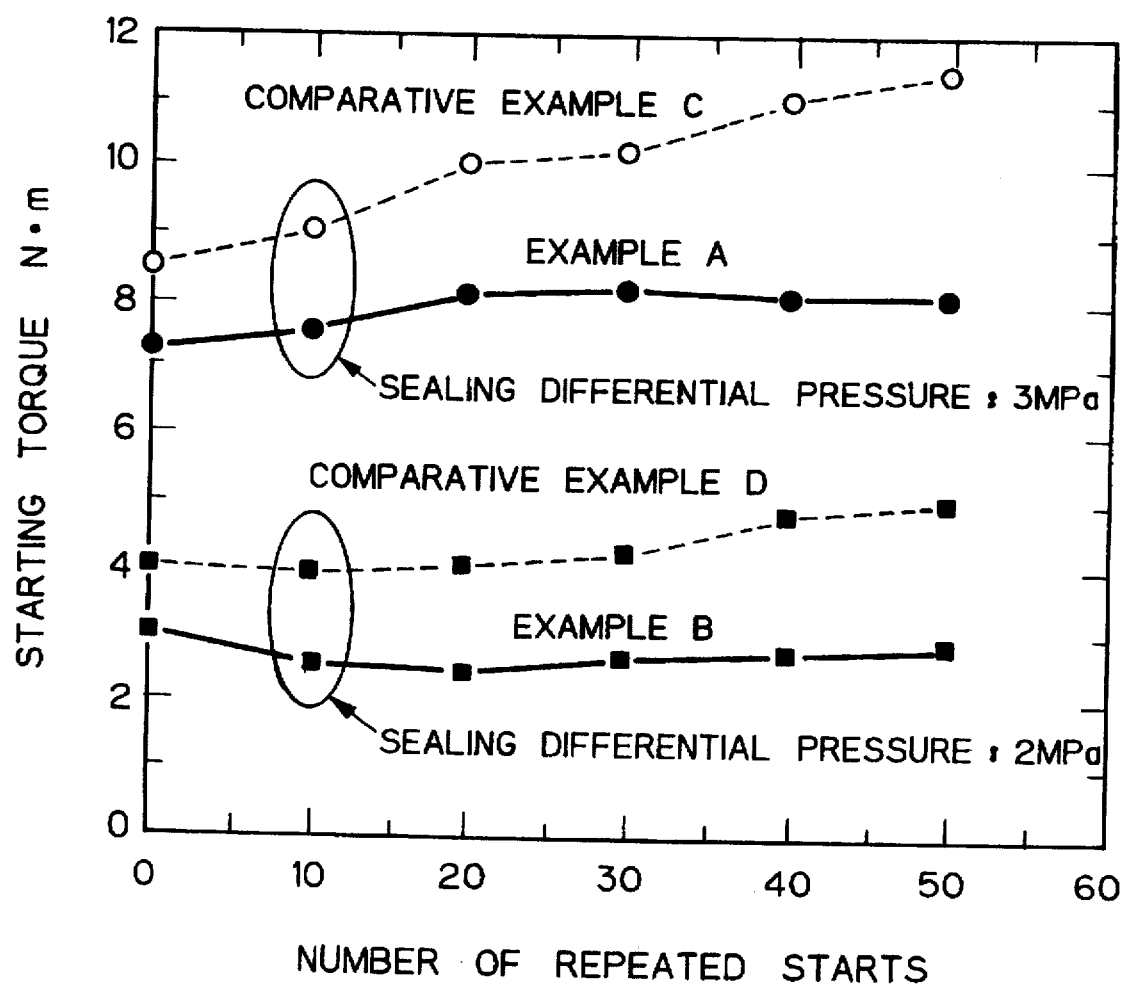
FIG. 12 shows the results of measurement of the number of starts and the starting torque in various combinations of rotating rings and a stationary ring of hard carbon.

FIG. 12 shows the results of measurement of starting torque when the above-described rotating ring 25 (mating ring) having a thin titanium nitride film formed on the sliding surface thereof was rotated to slide relative to a fixed ring 26 (stationary ring) made of carbon. In the figure, curve A represents Example A of the present invention, and curve C represents Comparative Example C in which a hard metal was used for the mating ring. In either case, the sealing differential pressure was 3 MPa. Curve B represents Example B of the present invention, and curve D represents Comparative Example D in which a hard metal was used for the mating ring. In either case, the sealing differential pressure was 2 MPa.

As will be clear from FIG. 12, for a large number of repeated starts, Examples A and B (curves A and B) of the present invention require a small starting torque for the rotating ring in comparison to Comparative Examples C and D (curves C and D), and thus have excellent sliding characteristics.

Figure 13:
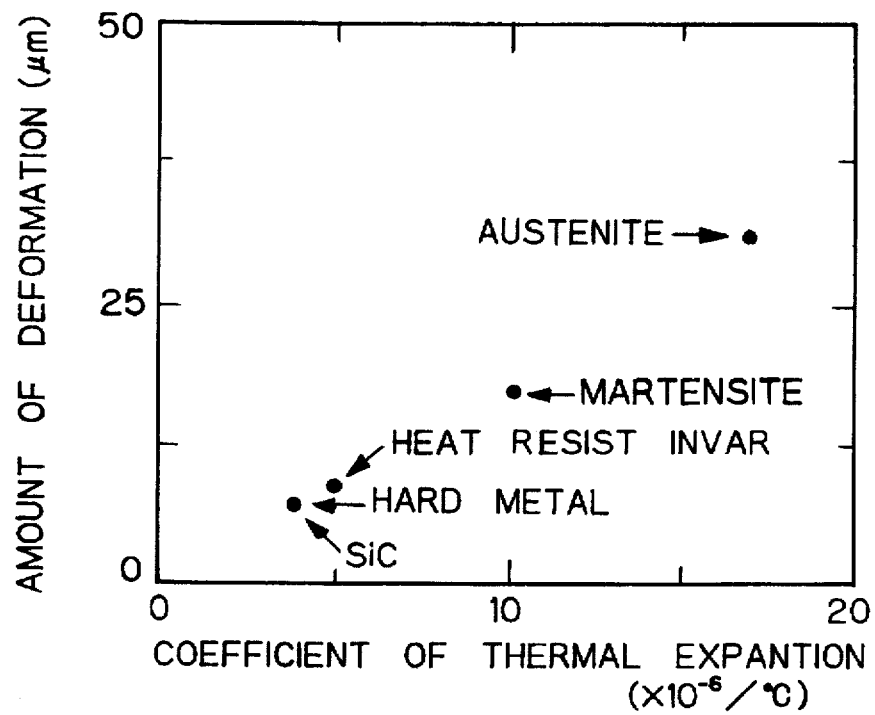
FIG. 13 shows the relationship between an amount of deformation of a rotating ring and the coefficient of thermal expansion of various material used in the rotating ring.
Figure 14:
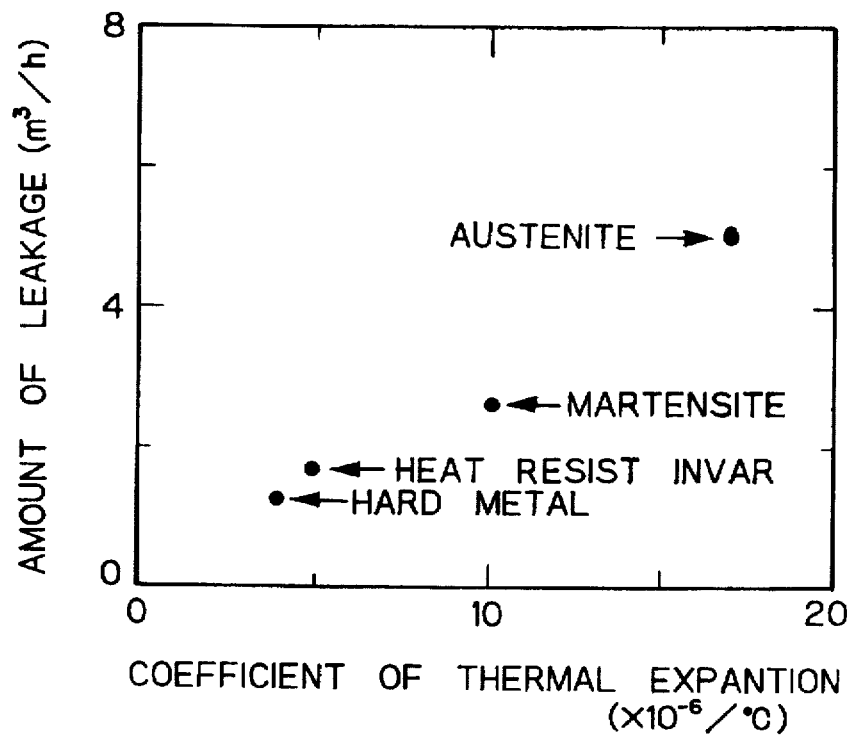
FIG. 14 shows the relationship between an amount of fluid leakage in a seal and the coefficient of thermal expansion of various material used in a rotating ring of the seal.

FIGS. 13 and 14 respectively show the relationship between the thermal expansion coefficient of various materials used in a substrate of a rotating ring 25 and an amount of a deformation of the substrate of the ring and between the thermal expansion coefficient of various materials used in a substrate of a rotating ring and an amount of fluid leakage through a seal including the ring.

Figure 15:
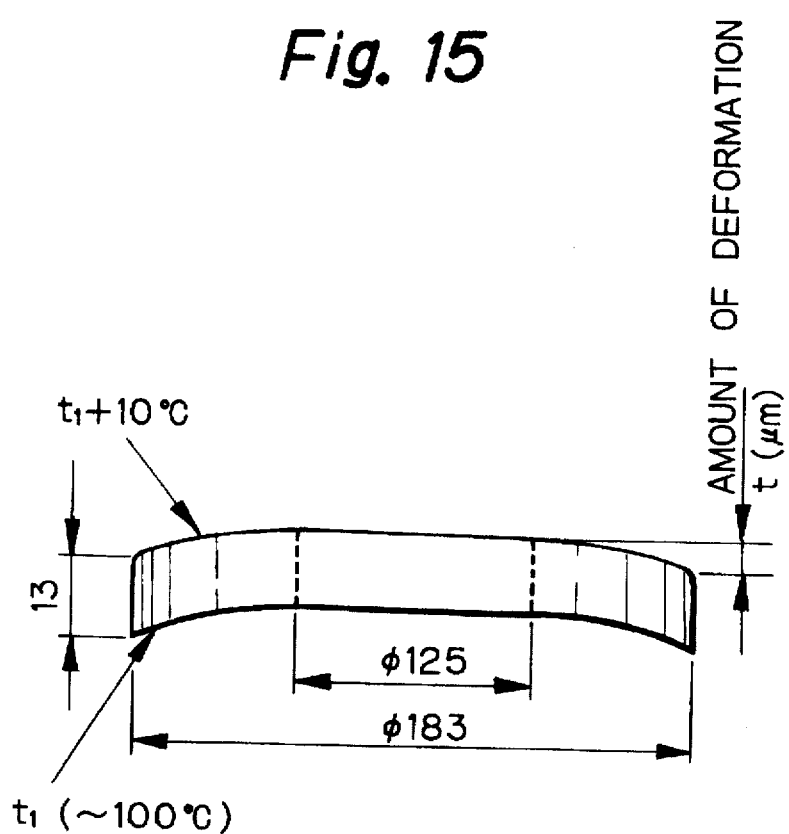
FIG. 15 is a view showing a size of a rotating ring used for calculating and measuring the amount of deformation and fluid leakage.
Figure 16:
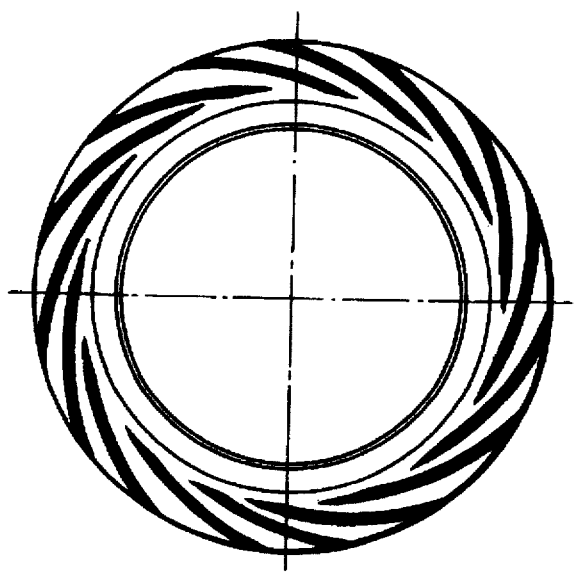
FIG. 16 is a view showing a shape of spiral grooves formed on the sliding surface of the rotating ring.

It should, however, be noted that an amount of deformation of a ring shown in FIG. 13 was obtained through calculation on a thermal analyzer program supposing that a substrate 2 of a ring 25 made of various materials has a size of FIG. 15, that dynamic spiral grooves (depth: 5±1 μm) having a shape as shown in FIG. 16 are formed on the sliding surface of the substrate (grooves are shown in black), and that there is different in temperature or temperature gradience by 10° C. between front and rear surfaces of the substrate due to temperature raising by frictional heat.

Also, an amount of leakage shown in FIG. 14 was obtained as follows.

First, a substrate 2 having a size as shown in FIG. 15 and spiral grooves with the shape of FIG. 16 are actually formed. Then, a thin titanium nitride film is formed on the substrate until the film thickness reached 3 μm by the dynamic ion mixing method explained above. Then, the rotating ring thus formed is assembled together with a fixed ring (stationary ring) made of a hardened carbon in a centrifugal compressor shown in FIG. 11 and an amount of fluid leakage from its high pressure side H to a low pressure side L was measured with its sealing differential pressure being kept at 3 Mpa and with its rotating speed being kept at 12000 rpm.

A thin titanium nitride film is formed on the substrate under the same conditions as stated above. Namely, first a material for each substrate 2 was processed into a predetermined ring shape (FIG. 15). Then, the substrate was subjected to hardening (after being held at 1,050° C. for 1 hour, the substrate was subjected to oil quenching) and tempering (after being held at 650° C. for 2 hours, the substrate was subjected to furnace cooling). Thereafter, a surface of the substrate 2 on which a film was to be formed was lapped until the surface roughness Rmax reached 0.1 μm or less and an amount of deformation t reached within 0.5 μm. A member which is to be mated with the substrate 2, that is, a stationary member of the seal or bearing, is formed by using a commercially available resin-impregnated hard carbon material and lapping the sliding surface of the carbon material.

The lapped surface of the substrate 2 was irradiated with a nitrogen ion beam at an incidence angle of 45° for 3 minutes (acceleration voltage: 10 kV; current density: 0.2 mA/cm²), thereby sputter-cleaning the surface. Thereafter, titanium was evaporated so that the titanium deposition rate was from 0.5 to 5.0 nm/s, and at the same time, the surface of the substrate 2 was irradiated with a nitrogen ion beam at an incidence angle of 45° (acceleration voltage: 15 kV; current density: 0.2 mA/cm²), thereby forming a titanium nitride film until the film thickness reached 3 μm.

As will be understood from FIGS. 13 and 14, when a material having a low thermal expansion coefficient, such as a hard metal, a heat resistance Invar or a martensite stainless steel, is used as a material of the substrate, an amount of deformation of the ring and fluid leakage through a seal including the ring are relatively small compared with those of a conventional material (i.e., austenite stainless steel, in this case) and, therefore, a superior sealing effect and wear resistance characteristics can be obtained. Incidentally, a material having low thermal expansion coefficient to be used in a movable or stationary member is not limited to the material referred to above and another material such as a titanium alloy or the like may be used if their thermal expansion coefficient is $10 \times 10^{-6}$ or less.

Figure 17:
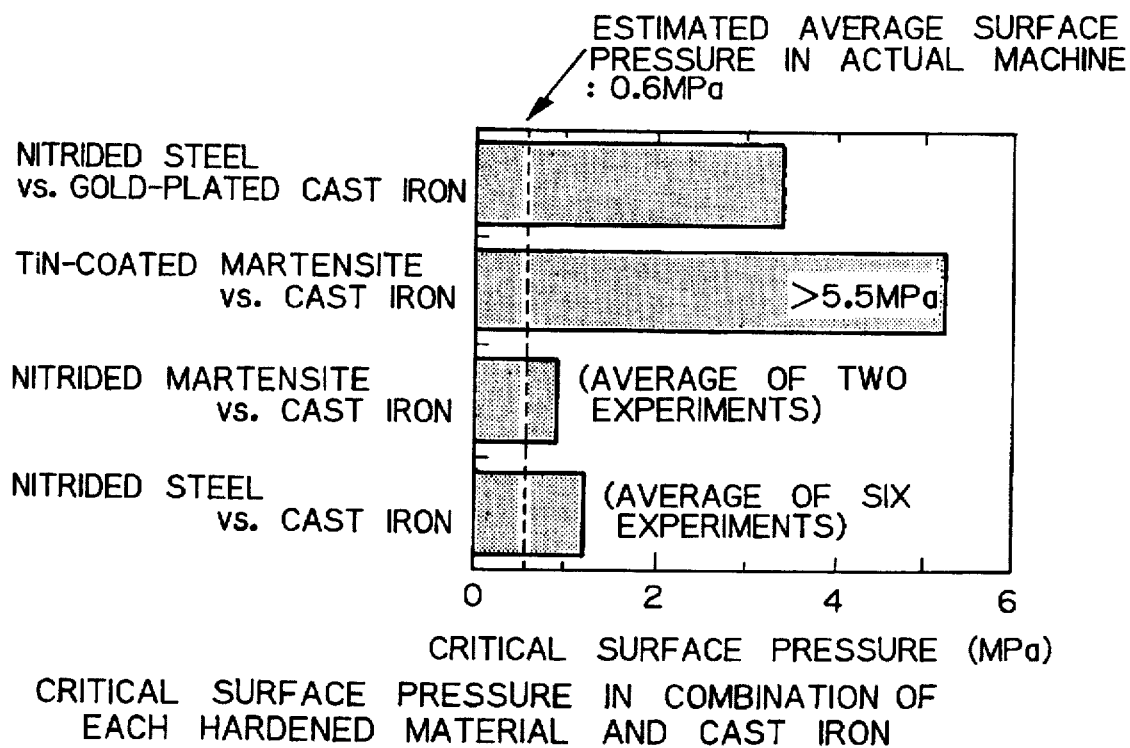
FIG. 17 shows the result of a frictional wear testing in various combination between a rotating ring of a hardened material and a stationary ring of a cast iron.

FIG. 17 shows a result of frictional wear test in various combination between a rotating ring made of hardened material and a stationary ring made of a cast iron used in a seal or bearing.

As a material for a rotating ring of the invention, a martensite stainless steel coated at the surface thereof with a thin titanium nitride film by the dynamic ion mixing method was used. After being tempered at 650° C. (JIS), the stainless steel was processed into a predetermined ring shape, and the sliding surface thereof was lapped until the surface roughness Rmax reached 0.05 μm or less. It should be noted that a fixed ring under test as a mating member was formed by using a cast iron and lapping the sliding surface thereof (Rmax: of the order of 1 μm).

A thin titanium nitride film was formed to a thickness of 3 μm on the sliding surface of the rotating ring martensite stainless steel by the dynamic ion mixing method. The film forming conditions were the same as in the previous ones. The hardness of the film was Hv3500.

Figure 18:
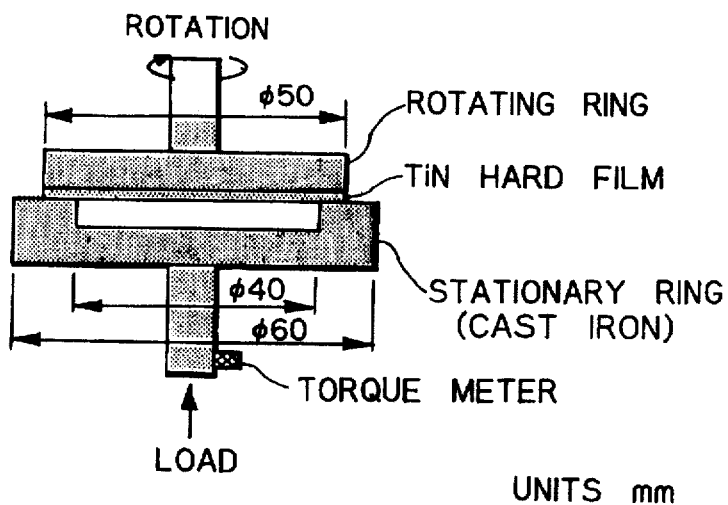
FIG. 18 shows the arrangement of a testing machine used to carry out the test for frictional wear.

Frictional wear testing was carried out by sliding ring-shaped test specimens or rings on each other at a predetermined sliding speed and under a predetermined surface pressure. FIG. 18 is a schematic view showing an arrangement for the frictional wear testing, and Table 2 shows the testing conditions. The testing was started with a surface pressure of 0.6 Mpa, and the surface pressure was stepwisely increased by 0.3 Mpa up to a maximum surface pressure of 5.5 Mpa. A level of pressure at which the torque rapidly rose or changed was defined as a critical surface pressure. After the sliding test, damage conditions of the sliding surface were observed with an optical microscope and measured with a contact type surface roughness tester.

TABLE 2

| Frictional wear testing conditions |
|---|
| Surface pressure: 0.6 to 5.5 Mpa (estimated average surface pressure in actual machine: 0.6 MPa) |
| Sliding speed: 1.2 m/s |
| Number of starts and stops: 10 (operating time: 5 s; suspension time: 20 s) |
| Testing oil: DHP5E (highly-purified mineral oil) |
| Testing temperature: 195 ± 5° C. |

FIG. 17 comparatively shows the critical surface pressure in the combination of a thin titanium nitride film coated material and a cast iron and critical surface pressures in other combinations of other hardened materials and the cast iron. The critical surface pressures of nitride steel and ionitrided martensite stainless steel are as low as 1.2 MPa and 0.9 MPa, respectively. On the other hand, the titanium nitride film formed by the dynamic ion mixing method has a considerably improved critical surface pressure, i.e., 5.5 MPa or more. The damage conditions of the sliding surfaces were observed after the frictional wear testing. There are no traces of wearing damage on the sliding surface of the titanium nitride film formed by the dynamic ion mixing method, and the cast iron constituting the mating member suffers slight damage. In contrast, the ionitrided martensite stainless steel shows damage in the form of adhesive wear, and the cast iron constituting the mating member is observed to be considerably damaged. These results confirm that the titanium nitride film has superior wear resistance and drag resistance in comparison to the conventional hardened materials, and exhibits favorable frictional wear characteristics.

Figure 19:
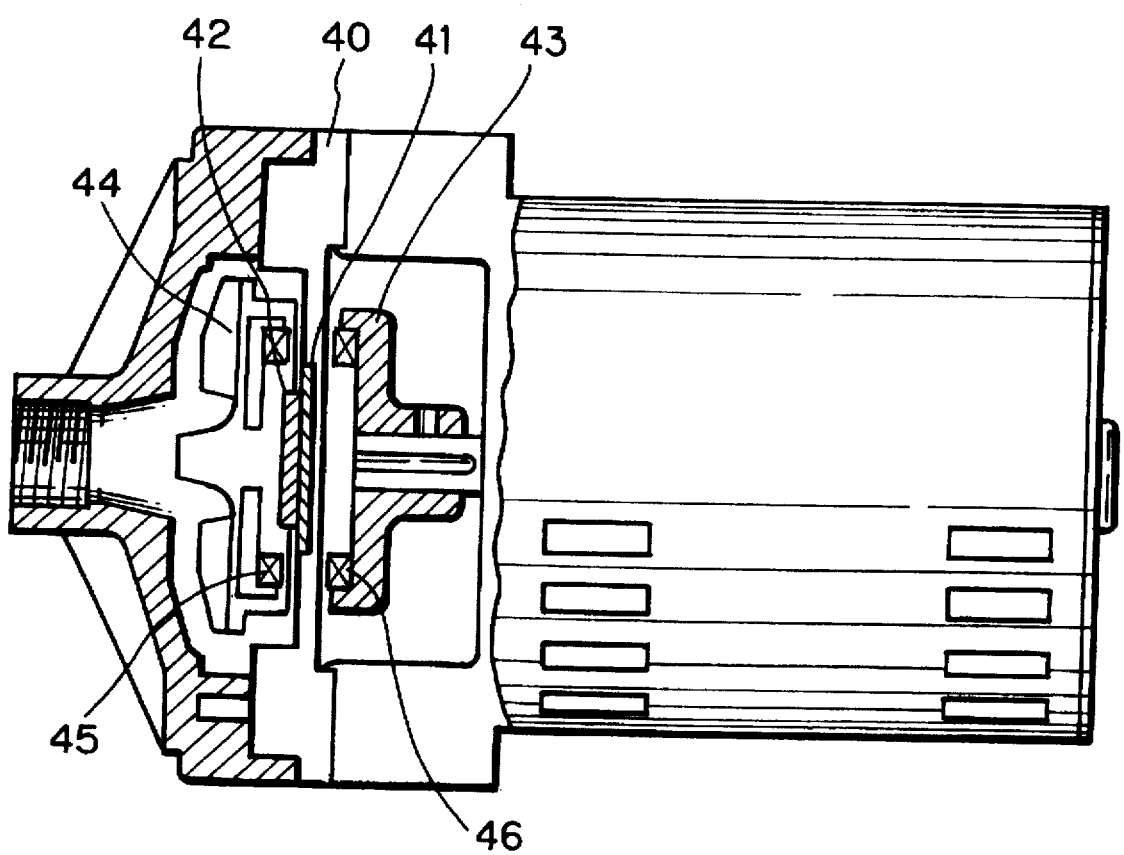
FIG. 19 shows an example of the arrangement of a thrust bearing of a magnet pump to which the present invention may be applied.

FIG. 19 Shows an arrangement in which the present invention is applied to a thrust bearing of a magnetic pump. Reference numeral 40 denotes a partition plate. A stationary member 41 which constitutes the thrust bearing is secured to the partition plate 40. A movable member 42 which constitutes the thrust bearing is secured to an impeller 44 so as to face opposite to the stationary member 41. A permanent magnet 46 is secured to a magnetic coupling 43, and another permanent magnet 45 is secured to the impeller 44. The permanent magnets 45 and 46 face each other across the partition plate 40. When the magnetic coupling 43 is rotated, the rotational force is transmitted to the impeller 44 by magnetic attraction force or magnetic repulsion force acting between the permanent magnets 45 and 46, causing the impeller 44 to rotate by being supported by the thrust bearing in the thrust direction.

The above-described thin titanium nitride film is formed on the sliding surface of the movable member 42, which constitutes the thrust bearing, by the dynamic ion mixing method. The stationary member 41 is formed by using a material consisting essentially of carbon. With the above-described arrangement, it is possible to form a thrust bearing which has a minimal coefficient of friction and a minimal specific rate of wear of carbon, and which is excellent in frictional characteristics. A radial bearing having similar features can be formed by adopting an arrangement (not shown) in which a thin titanium nitride film is formed on the sliding surface of a movable member of the radial bearing, and a stationary member constituting the radial bearing is formed by using a material consisting essentially of carbon.

Although in the above-described examples a metallic material is used for the substrate, it should be noted that the present invention is not necessarily limited thereto. It has been confirmed that similar advantageous effects can be obtained even in a case where a hard metal or ceramic material is used for the substrate.

Although in the above-described examples the movable member of the bearing is formed by using a metallic material or a hard metal or ceramic material, and a thin titanium nitride film is formed on the sliding surface thereof, the arrangement may be such that the stationary member is formed by using a metallic material or a hard metal or ceramic material, and a thin titanium nitride film is formed on the sliding surface thereof, and that the movable member is formed by using a material consisting essentially of carbon, in reverse relation to the foregoing arrangement.

Although in the above-described example a resin-impregnated hard carbon material or hard carbon is used as a material of a member which is to be mated with the substrate on which a thin titanium nitride film is formed, it should be noted that the material is not limited thereto. The material may widely be a carbon containing material including a material consisting essentially of carbon or a material impregnated with carbon. Further, the carbon containing material may include a carbon containing composite material (e.g., a carbon fiber reinforced composite material), a carbon steel, a cast iron, a carbide (e.g., SiC, $Cr_3C_4$, TiC) a carbon coated material (e.g., diamond like carbon [DLC] film, TiC film) and a polymer.

As has been described above, the present invention provides the following advantageous effects.

(1) By providing a thin titanium nitride film on the sliding surface of a movable or stationary member made of a low thermal expansion coefficient material, and by combining it with a stationary or movable member made of a carbon containing material, it is possible to provide a seal or bearing which is subjected to a small amount of deformation and fluid leakage and exhibits excellent seal characteristic as well as slow coefficient of friction and excellent wear resistance.

(2) In particular, by combining a movable or stationary member provided with the thin titanium nitride film stated above and a stationary or movable member made of a cast iron, it is possible to provide a seal or bearing which has superior wear resistance and drag resistance and exhibits favorable frictional wear characteristic.

(3) By setting the dose energy of the nitrogen ion beam within the range of from 0.1 $W/cm^2$ to 6 $W/cm^2$, a thin titanium nitride film which is superior in both hardness and adhesion can be formed on the sliding surface of the movable member. That is, the thin titanium nitride film has a Vickers hardness of 2,500 or more, and the adhesion of the film to the substrate material is 2.8 GPa or more in terms of the shear stress measured by a scratch test.

What is claimed is:

1. A seal or bearing comprising a combination of a movable member and a stationary member, either one of said movable and stationary members being made of a low thermal expansion coefficient material, and the other being made of a carbon containing material, wherein a thin titanium nitride film is formed on a sliding surface of said movable or stationary member which is made of said low thermal expansion coefficient material, said titanium nitride film having a Vickers hardness of 2500 or more.

2. A seal or bearing claimed in claim 1, wherein said carbon containing material comprises a material consisting essentially of carbon or a material impregnated with carbon.

3. A seal or bearing claimed in claim 1, wherein said carbon containing material comprises a carbon containing composite material, a carbon steel, a cast iron, a carbide or a carbon coated material or polymer.

4. A seal or bearing claimed in any one of claims 1 to 3, wherein said thin titanium nitride film is formed by irradiating said sliding surface of said movable or stationary member which is made of said low thermal expansion coefficient material with an ion beam consisting essentially of nitrogen ions at the same time as titanium is vacuum-deposited on said sliding surface.

5. A seal or bearing claimed in claim 4, wherein a dose energy of said nitrogen ion beam is in a range of from 0.1 $W/cm^2$ to 6 $W/cm^2$.

6. A seal or bearing claimed in any one of claims 1 to 3, wherein a coefficient of thermal expansion of said low thermal expansion coefficient material is lower than $10 \times 10^{-6}/°C$.

7. A seal or bearing claimed in claim 6, wherein said low thermal expansion coefficient material comprises a heat resistance Invar alloy, a hard metal, a stainless steel or a ceramic.

8. A seal or bearing claimed in any one of claims 1 to 3, wherein the thickness of said thin titanium nitride film is 2 μm or more.

9. A seal or bearing claimed in any one of claims 1 to 3, wherein the adhesion between said thin titanium nitride film and said low thermal expansion coefficient material is 2.8 GPa or more.

10. A seal or bearing claimed in any one of claims 1 to 3, wherein the surface roughness Rmax of said sliding surface of said thin titanium nitride film is 0.5 μm or less.

* * * * *